United States Patent
Chiu et al.

(10) Patent No.: US 10,121,811 B1
(45) Date of Patent: Nov. 6, 2018

(54) METHOD OF HIGH-ASPECT RATIO PATTERN FORMATION WITH SUBMICRON PIXEL PITCH

(71) Applicant: Taiwan Semiconductor Manufacturing Co., Ltd., Hsinchu (TW)

(72) Inventors: Wei-Chao Chiu, Hsinchu (TW); Chih-Chien Wang, Changhua (TW); Feng-Jia Shiu, Hsinchu (TW); Ching-Sen Kuo, Taipei (TW); Chun-Wei Chang, Tainan (TW); Kai Tzeng, Neipu Township (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/686,916

(22) Filed: Aug. 25, 2017

(51) Int. Cl.
*H01L 21/00* (2006.01)
*H01L 27/146* (2006.01)

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14685* (2013.01); *H01L 27/14687* (2013.01)

(58) Field of Classification Search
None
See application file for complete search history.

(56) References Cited

U.S. PATENT DOCUMENTS

| | | | |
|---|---|---|---|
| 7,390,611 B2 | 6/2008 | Lee | |
| 7,638,650 B2 | 12/2009 | Qiu | |
| 8,133,661 B2 | 3/2012 | Chang et al. | |
| 8,216,767 B2 | 7/2012 | Wang et al. | |

(Continued)

FOREIGN PATENT DOCUMENTS

| | | |
|---|---|---|
| CN | 103107157 A | 5/2013 |
| KR | 20030000475 A | 1/2003 |

(Continued)

OTHER PUBLICATIONS

TW OA in related application TW106135960 dated May 14, 2018.

*Primary Examiner* — Angel Roman
(74) *Attorney, Agent, or Firm* — McDermott Will & Emery LLP (57) ABSTRACT

Implementations of the disclosure provide a method of fabricating an image sensor device. The method includes forming first trenches in a first photoresist layer using a first photomask having a first pattern to expose a first surface of a substrate, directing ions into the exposed first substrate through the first trenches to form first isolation regions in the substrate, removing the first photoresist layer, forming second trenches in a second photoresist layer using a second photomask having a second pattern to expose a second surface of the substrate, the second pattern being shifted diagonally from the first pattern by half mask pitch, directing ions into the exposed second surface through the second trenches to form second isolation regions in the substrate, the first and second isolation regions being alternatingly disposed in the substrate, and the first and second isolation regions defining pixel regions therebetween, and removing the second photoresist layer.

20 Claims, 9 Drawing Sheets

(56) References Cited

U.S. PATENT DOCUMENTS

| | | |
|---|---|---|
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 9,429,846 B2 | 8/2016 | Hatakeyama et al. |
| 2008/0138746 A1 | 6/2008 | Kondoh et al. |
| 2010/0201834 A1 | 8/2010 | Maruyama et al. |
| 2012/0153418 A1* | 6/2012 | Nakadate .......... H01L 27/14605 257/432 |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0087539 A1* | 3/2014 | Lizio .................... H01L 29/861 438/306 |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2016/0268220 A1 | 9/2016 | Tsai et al. |
| 2017/0186808 A1 | 6/2017 | Chiu et al. |

FOREIGN PATENT DOCUMENTS

| | | |
|---|---|---|
| KR | 20030056359 A | 7/2003 |
| KR | 20060102244 A | 9/2006 |
| TW | 200933882 A | 8/2009 |
| TW | 201111329 A | 4/2011 |
| TW | 201520701 A | 6/2015 |
| TW | 201639135 A | 11/2016 |
| TW | 201727885 A | 8/2017 |

\* cited by examiner

METHOD OF HIGH-ASPECT RATIO PATTERN FORMATION WITH SUBMICRON PIXEL PITCH

BACKGROUND

Image sensor devices are widely used in various imaging applications and products, such as digital still cameras or mobile phone camera applications. These devices utilize an array of sensor elements (pixels) in a substrate. The pixels may be photodiodes or other photosensitive elements that are adapted to absorb light projected toward the substrate and convert the sensed light into electrical signals. To receive more light, it is advantageous to increase the number of the pixels in the image sensor devices.

The ever-shrinking geometry size brings challenges to image sensor device fabrication. For example, the fabrication process may require photoresist masks with high aspect ratio to produce pixels that are micron or sub-micron in size. However, photoresist masks with high aspect ratio are more prone to the effects of capillary forces. These effects are exacerbated as the aspect ratio of the mask increase and/or as the pitch decreases. As a result, photoresist masks may collapse, for example, due to the pulling effect of capillary forces between adjacent photoresist masks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include implementations in which the first and second features are formed in direct contact, and may also include implementations in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various implementations and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
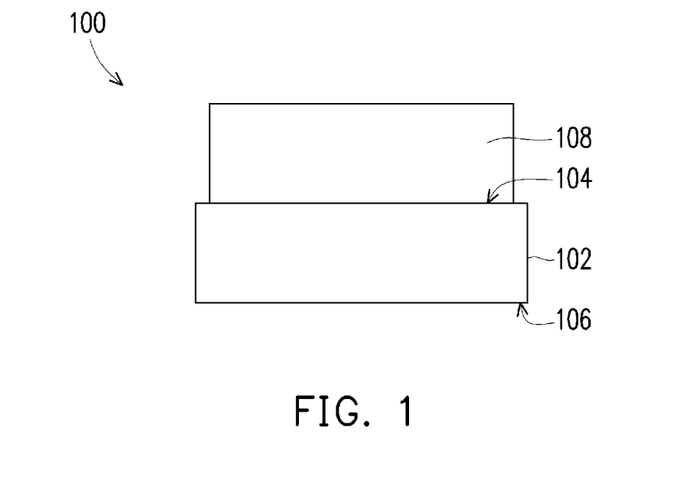
FIG. 1 illustrates a cross-sectional view of a portion of an image sensor device in accordance with one implementation.

FIG. 1 illustrates a simplified cross-sectional view of a portion of an image sensor device 100 in accordance with an implementation. The image sensor device 100 may be used in various electronic devices for capturing images, such as cameras, cellular telephones, personal digital assistants, computers, etc. Examples of such an image sensor device may include a complementary metal-oxide semiconductor (CMOS) image sensor (CIS) device, a charged-coupled device (CCD), an active-pixel sensor (APS) device, or a passive-pixel sensor device. In one implementation, the image sensor device 100 is a backside illuminated (BSI) image sensor device. While the present disclosure is described with respect to backside illuminated image sensor devices, the implementations of the disclosure may also be applied to a front side illuminated (FSI) image sensor device. The image sensor device 100 may be a CIS and includes a device substrate 102. The device substrate 102 is, for example, a bulk substrate of silicon, an epitaxial layer over a silicon substrate, a semiconductor wafer, a silicon germanium substrate, or a silicon-on-insulator (SOI) substrate. Other semiconductor materials including group III, group IV, and group V elements may be used in some implementations. The device substrate 102 may be undoped in some implementations. In some other implementations, the device substrate 102 is doped with a p-type dopant such as boron (i.e., a p-type substrate) or an n-type dopant such as phosphorous or arsenic (i.e., an n-type substrate). The device substrate 102 could optionally include a compound semiconductor and/or an alloy semiconductor. In some implementations, the device substrate 102 could include an epitaxial layer, which may be strained for performance enhancement.

The device substrate 102 has a front side (also referred to as a front surface) 104 and a back side (also referred to as a back surface) 106 opposing the front side 104. For a BSI image sensor device such as the image sensor device 100, light or radiation is incident upon the back side 106 (after a substrate thinning process) and enters the remaining device substrate 102 through the back side 106. The front side 104 is an active surface on which circuit designs, such as transistor, contact, and interconnection features, will be formed to provide external communication with the pixels in the pixel regions. It is understood that FIGS. 1-13 and FIGS. 15-16 have been simplified for a better understanding of the inventive concepts of the present disclosure and therefore may not be drawn to scale.

A first photoresist layer 108 is formed over the front side 104 of the device substrate 102. The first photoresist layer 108 may be formed by depositing (e.g., spin-coating) a photoresist film over the front side 104 of the device substrate 102 and thereafter patterning the photoresist film in a first lithography process, which may involve one or more processes such as exposure, post-exposure bake, developing, etc. The first lithography process may utilize a lithography apparatus to pattern the first photoresist layer 108. The lithography apparatus generally includes a radiation source to provide radiation energy, a lens system to project radiation energy for lithography patterning, and a mask stage having a scan function. The radiation source may be a suitable light source such as an ultra-violet (UV), deep ultra-violet (DUV), or extreme ultra-violet (EUV) source. For example, the radiation source may include, but is not limited to, a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; a mercury lamp having a wavelength of 436 nm or 365 nm; or other light sources having a wavelength below approximately 100 nm. The lens system may include one or more illumination modules designed to direct radiation beams from the radiation source onto a photomask. The mask stage is operable to secure the photomask and manipulate the photomask in transitional and/or rotational modes. The lithography apparatus also includes a substrate stage for holding and manipulating a substrate to be patterned in transitional and/or rotational modes during the first lithography process. It is understood that the manipulation of the substrate is considered relative to the photomask so that one or both of the mask stage and substrate stage can move to achieve the desired manipulation. An alignment device can be used to align the photomask and the substrate.

Figure 2:
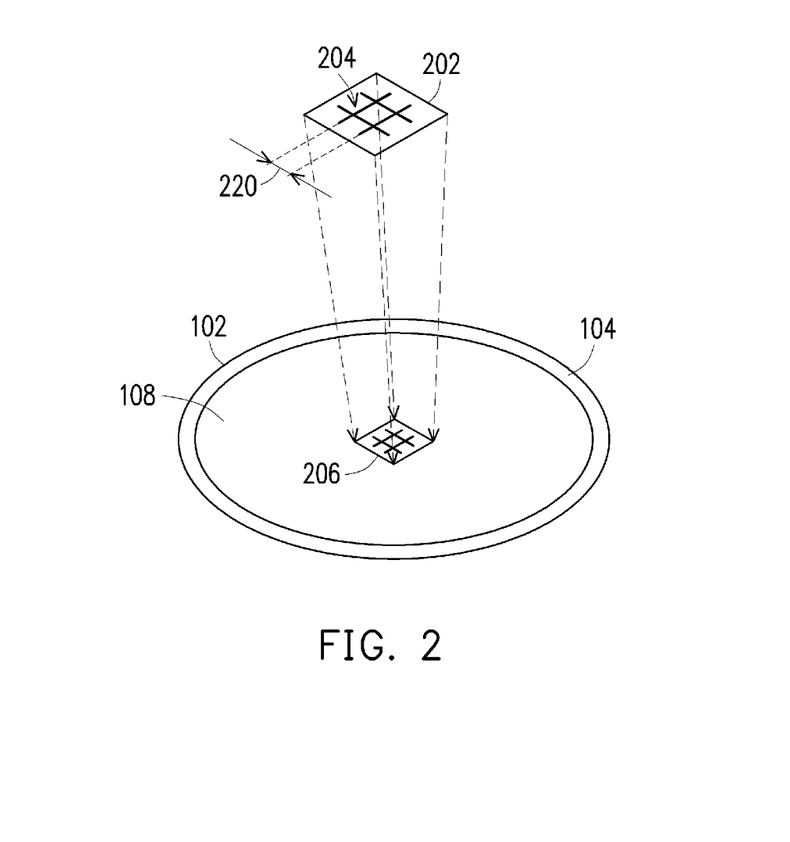
FIG. 2 illustrates a diagrammatic view of a first lithography process being performed to transfer an image onto the first photoresist layer on the device substrate in accordance with one implementation.

FIG. 2 illustrates a diagrammatic view of a first lithography process being performed to transfer an image onto the first photoresist layer 108 on the device substrate 102 in accordance with one implementation. For simplicity, FIG. 2 only shows a portion of the first photoresist layer 108 receiving the image. During the first lithography process, a photomask, such as a first photomask 202 with a first pattern 204 shown in FIG. 2, is loaded onto the mask stage, and the device substrate 102 is loaded onto the substrate stage. The first pattern 204 may have various features such as lines, holes, grids, or any desired shape such as polygons, depending on the features to be formed in the first photoresist layer 108. In one implementation, the first pattern 204 has a grid-like pattern. The grid-like pattern may be composed of repeating features, for example two pluralities of parallel lines, wherein the lines belonging to one of the pluralities are arranged transverse to the lines belonging to the other plurality to form a plurality of squares. The radiation beam may scan over the first photomask 202. The features of the first pattern 204 allow the radiation beam to pass through and expose a field 206 on the device substrate 102. The field 206 may define a die (or chip). In one implementation, the field 206 contains one or more pixel array regions defined in the device substrate 102. As such, the first pattern 204 is transferred onto the first photoresist layer 108 at the exposure field 206. The lithography apparatus steps the device substrate 102 to a next field (e.g., one scanning field) to expose another field. This step-and-scan process is performed until the entire device substrate 102 is exposed with the first pattern 204. The radiation beam contacts and changes the chemical composition of the first photoresist layer 108 such that a developer can subsequently remove the exposed portions of the first photoresist layer 108.

The grid-like pattern has a constant mask pitch at above sub-micrometer levels. In one implementation, the grid-like pattern has a mask pitch 220 greater than 1 micrometer, such as about 1.15 micrometers to about 3 micrometers, for example about 1.2 micrometers to about 1.9 micrometers. In one implementation, the grid-like pattern has a mask pitch 220 of about 1.8 micrometers. The term "mask pitch" described herein refers to a width of the feature (e.g., line) plus the distance to the next immediately adjacent feature. It is understood that the mask pitch 220 of the first pattern 204 may vary depending on the critical dimension (CD) of the pattern(s) to be formed in the first photoresist layer 108 per application needs.

Figure 3:
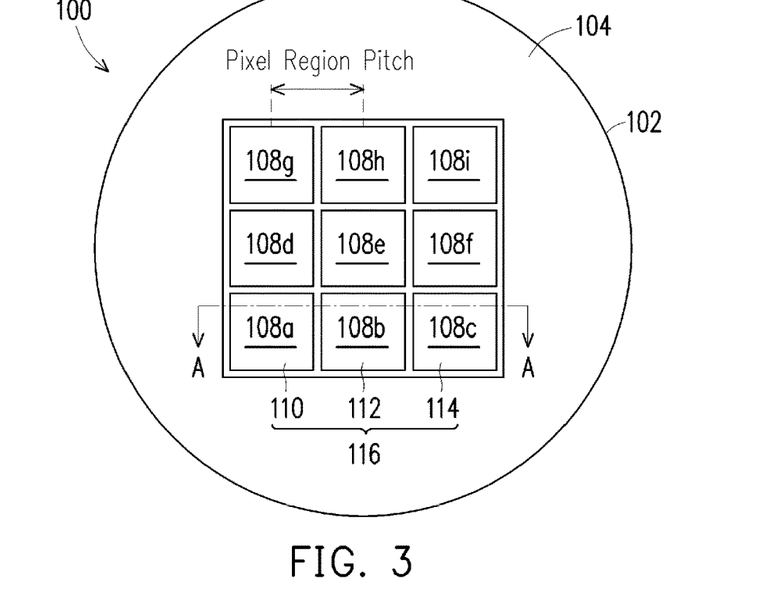
FIG. 3 illustrates a top view of a portion of the image sensor device showing the first pattern has been transferred to the first photoresist layer to form first photoresist columns on the front side of the device substrate in accordance with one implementation.

FIG. 3 illustrates a top view of a portion of the image sensor device 100 showing the first pattern 204 has been transferred to the first photoresist layer 108 to form first photoresist columns 108a-108i on the front side 104 of the device substrate 102 in accordance with one implementation. It should be understood that nine (9) first photoresist columns 108a-108i are shown here for illustration purposes only. The first photoresist layer 108 may include any numbers of first photoresist columns depending on the first pattern 204 required for the application. For simplicity, only three photoresist columns 108a-108c of the first photoresist layer 108 will be discussed herein.

Figure 4:
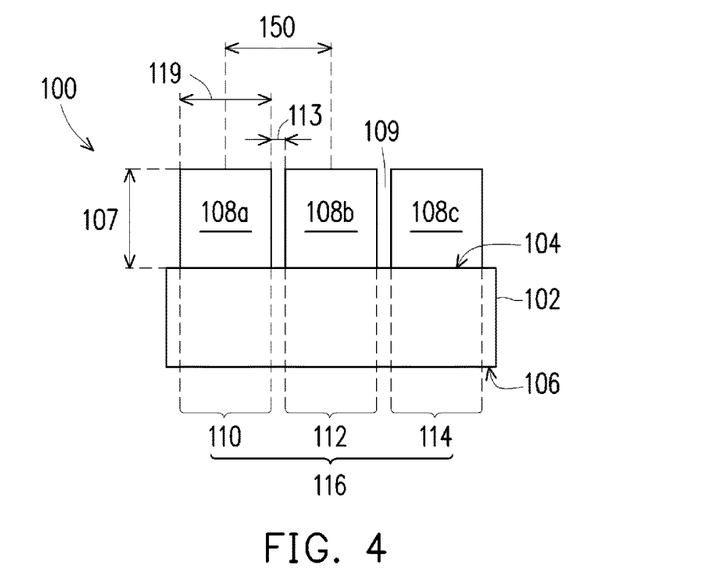
FIG. 4 illustrates a cross-sectional view of the image sensor device taken along line A-A of FIG. 3.

FIG. 4 illustrates a simplified cross-sectional view of the image sensor device 100 taken along line A-A of FIG. 3. Photoresist columns 108a, 108b, and 108c define pixel regions for the image sensor device 100. For example, each of the photoresist columns 108a, 108b, and 108c defines a pixel region 110, 112, and 114, respectively, in the device substrate 102. The pixel regions 110, 112, and 114 are regions where one or more pixels are to be formed. The pixel regions 110, 112, and 114 may be collectively referred to as a pixel array region 116. A logic region (not shown) is typically disposed outside the pixel array region 116. The resist pitch 150 of the first photoresist columns 108a, 108b, 108c substantially corresponds to the mask pitch 220 of the first pattern 204. The term "resist pitch" refers to a center-to-center distance between two immediately adjacent photoresist columns. The pixel region pitch of the pixel regions 110, 112, and 114 generally corresponds to the resist pitch 150 of the first photoresist columns 108a, 108b, 108c. The term "pixel region pitch" described herein refers to a center-to-center distance between two adjacent pixel regions. In cases where the grid-like pattern discussed above is used, the pixel region pitch of the pixel regions 110, 112, and 114 is greater than 1 micrometer, such as about 1.15 micrometers to about 2 micrometers, for example about 1.2 micrometers to about 1.9 micrometers.

Each of the first photoresist column 108a, 108b, 108c has a height 107 (i.e., vertical dimension) and a width 119 (i.e., lateral dimension). An aspect ratio of the first photoresist columns 108a, 108b, 108c may be defined as a ratio of the height 107 to the width 119. For a pixel size on the order of 1 micrometer, each of the first photoresist columns 108a, 108b, 108c may have an aspect ratio of about 3:1 to 1:1, for example about 2:1. In one implementation, the first photoresist columns 108a, 108b, 108c each has an aspect ratio of about 1:1 The first photoresist columns 108a, 108b, 108c are separated by a gap or trench 109. The trench 109 has a height, which equals to the height 107 of the first photoresist columns 108a, 108b, 108c, and a width 113. An aspect ratio of the trench 109 may be defined as a ratio of the height 107 to the width 113. The trench 109 has an aspect ratio of 10:1 or above, such as about 12:1 to about 30:1, for example about 13:1 to about 25:1. Therefore, the aspect ratio of the first photoresist columns 108a, 108b, 108c is lower than the aspect ratio of the trench 109. In one implementation, the trench 109 has an aspect ratio of 15:1 to 20:1. In various implementations, the width 119 of each of the first photoresist columns 108a, 108b, 108c to the width 113 of the trench 109 may be at a ratio of about 4:1 to about 30:1, such as about 6:1 to about 20:1, for example about 8:1 to about 10:1.

While the trench 109 has an ultrahigh aspect ratio of 10:1 or above, for example 13:1 or above, the lower aspect ratio of the first photoresist columns 108a, 108b, and 108c provide sufficient strength to the first photoresist columns 108a, 108b, and 108c to withstand the capillary forces inside the trench 109 without collapsing. Specifically, ultrahigh aspect ratio trench and lower aspect ratio of the first photoresist columns 108a, 108b, 108c result in the increased width 109 of each of the first photoresist columns 108a, 108b, 108c, which leads to good adhesion of the first photoresist columns 108a, 108b, 108c to the front side 104 of the device substrate 102. Therefore, the likelihood of the first photoresist columns 108a, 108b, and 108c collapsing is reduced as compared to those high aspect ratio photoresist layers having high aspect ratio photoresist columns and trench aspect ratio of 10:1 or greater. As a result, the first photoresist columns 108a, 108b, 108c can be formed taller and/or closer together (i.e., having a higher aspect ratio trench between the first photoresist columns 108a, 108b, 108c) without risking collapse of the first photoresist columns 108a, 108b, 108c. The combination of the lower aspect ratio of the first photoresist columns 108a, 108b, and 108c (such as about 3:1 or lower) and an ultrahigh aspect ratio trench (such as 13:1 or greater) are advantageous in performing subsequent fabrication processes such as formation of isolation regions by ion implantation, which will be discussed in greater detail below in FIG. 5.

Figure 15:
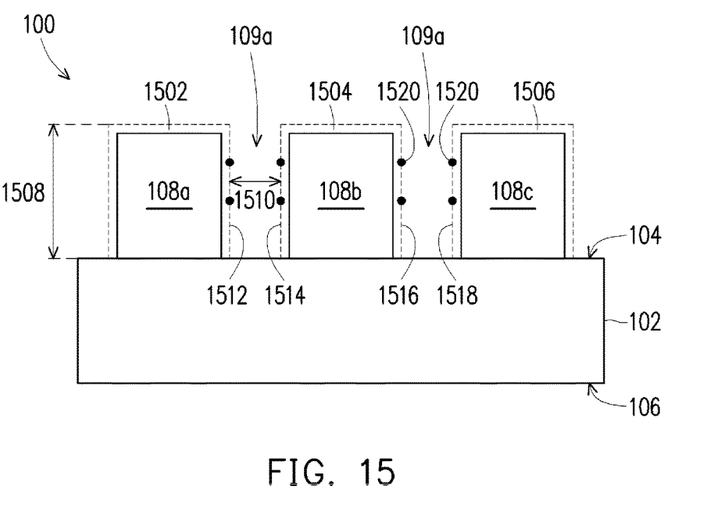
FIG. 15 illustrate a cross-sectional view of the image sensor device showing a cross-linking film on exposed surfaces of the photoresist columns in accordance with one implementation.
Figure 16:
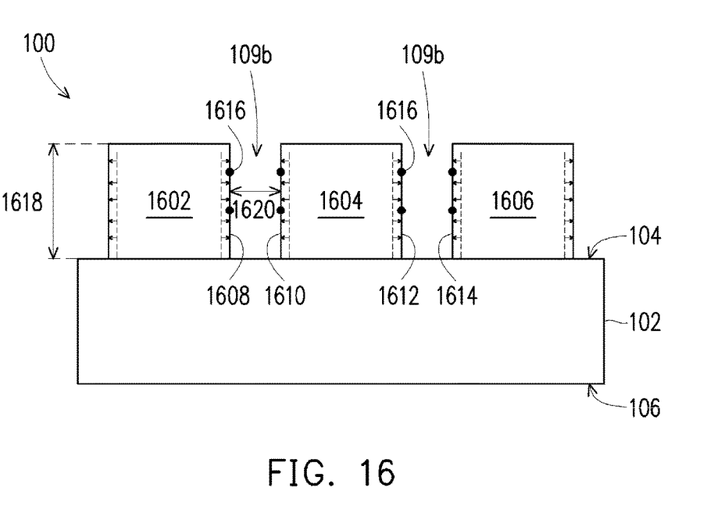
FIG. 16 illustrate a cross-sectional view of the image sensor device showing sidewalls of the photoresist columns in accordance with one implementation.

In some implementations, the likelihood of collapse of the first photoresist columns 108a, 108b, 108c can be further decreased by applying a shrinkage material to the exposed surfaces of the first photoresist columns 108a, 108b, 108c, which will be discussed in more detail in FIGS. 15 and 16.

Figure 5:
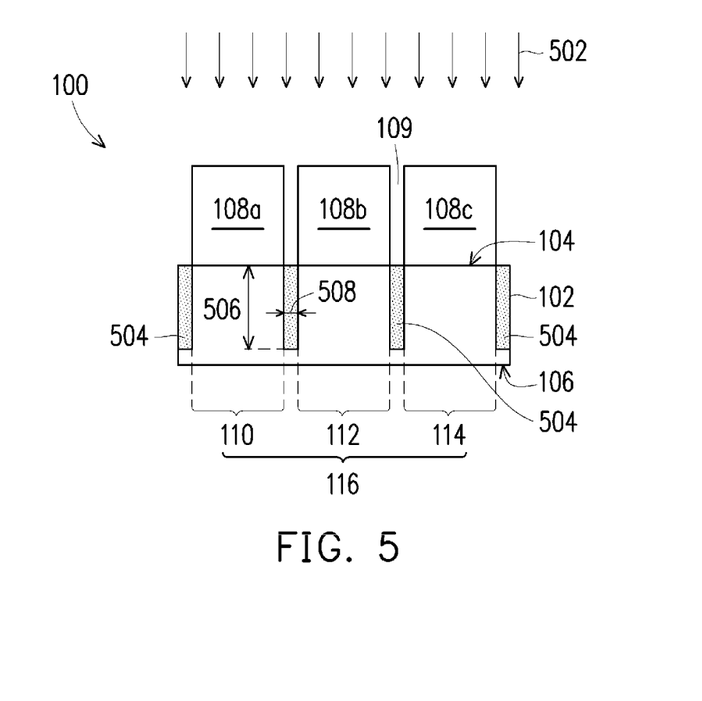
FIG. 5 illustrates a cross-sectional view of the device substrate after a first ion implantation process in accordance with one implementation.

After the first lithography process, the device substrate 102 is subjected to a first ion implantation process 502 to form first isolation regions 504 in the device substrate 102, as shown in FIG. 5. The first ion implantation process 502 is performed using the first photoresist columns 108a, 108b, and 108c as a mask to implant ions into regions of the device substrate 102 that are not protected by the first photoresist columns 108a, 108b, and 108c. The first isolation regions 504 isolate pixel regions 110, 112, and 114 from each other. The first isolation regions 504 prevent carriers at a specific pixel region to leak to adjacent pixel region (also referred to as crosstalk). In some implementations, the first isolation regions 504 may exceed the depth of each pixel to be formed in the pixel regions 110, 112, 114. In some implementations, the first isolation regions 504 may extend from the front side 104 to the back side 106 of the device substrate 102 to provide complete isolation well between the pixel regions 110, 112, and 114. Since the first photoresist columns 108a, 108b, and 108c are formed with ultrahigh aspect ratio trench between the first photoresist columns 108a, 108b, and 108c, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device 100.

The first isolation regions 504 may be formed of p-type or n-type materials. The first isolation regions 504 may be formed with a material having the same doping polarity as the device substrate 100. In one implementation, the first isolation regions 504 are p-type regions formed by implanting the device substrate 102 with p-type dopants such as boron, boron fluoride ($BF_2$), diborane ($B_2H_6$), or the like. The doping concentration of the first isolation regions 504 may be in the range of approximately $1\times10^{12}$ ions/cm$^3$ to approximately $1\times10^{20}$ ions/cm$^3$, for example about $1\times10^{18}$ ions/cm$^3$. In some implementations, the doping concentration of the first isolation regions 504 may be in the range of approximately $5\times10^{11}$ ions/cm$^3$ to approximately $5\times10^{17}$ ions/cm$^3$, for example about $5\times10^{15}$ ions/cm$^3$.

Each first isolation region 504 has a height 506 (vertical dimension) and a width 508 (lateral dimension). An aspect ratio of the first isolation region 504 may be defined as a ratio of the height 506 to the width 508. In one implementation, the first isolation regions 504 have an aspect ratio of 10:1 or above, for example about 12:1 to about 15:1.

Figure 6:
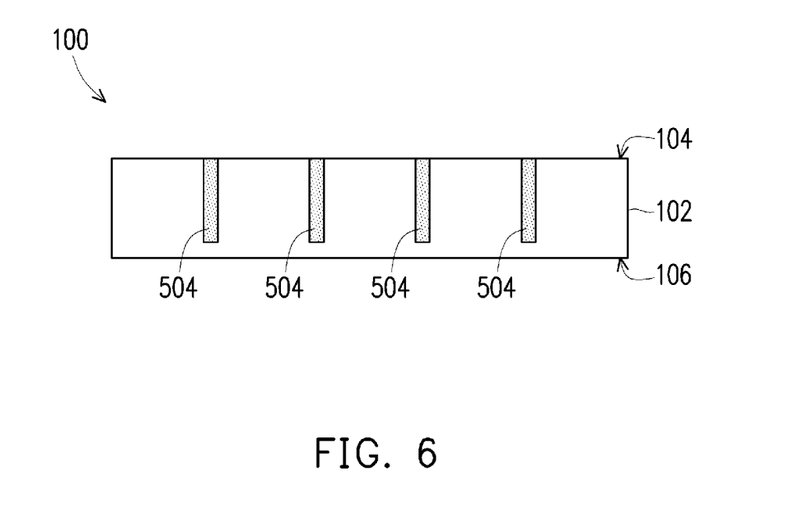
FIG. 6 illustrates a cross-sectional view of a portion of the image sensor device after the first photoresist layer has been removed.

After the first isolation regions 504 have been formed, the first photoresist columns 108a-108i (i.e., first photoresist layer 108) are removed, for example, using a photoresist ashing or stripping process. FIG. 6 illustrates a cross-sectional view of a portion of the image sensor device 100 after the first photoresist layer 108 has been removed.

Figure 7:
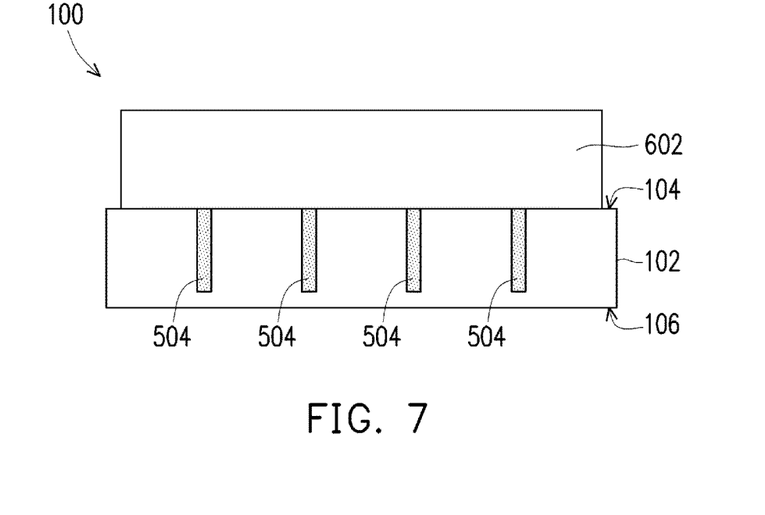
FIG. 7 illustrates a cross-sectional view of a second photoresist layer formed over the front side of the device substrate.

After the first photoresist layer 108 has been removed, a second photoresist layer 602 is formed over the front side 104 of the device substrate 102, as shown in FIG. 7. The second photoresist layer 602 may be formed by depositing (e.g., spin-coating) a photoresist film over the front side 104 of the device substrate 102 and thereafter patterning the photoresist film by a second lithography process in the same fashion as discussed above with respect to FIGS. 2-4. The second lithography process used to pattern the second photoresist layer 602 is similar to the first lithography process used for the first photoresist layer 108 except that the second lithography process uses a second photomask, which has a pattern that is about half mask pitch offset from the first pattern 204 of the first photomask 202, to pattern the second photoresist layer 602.

Figure 8:
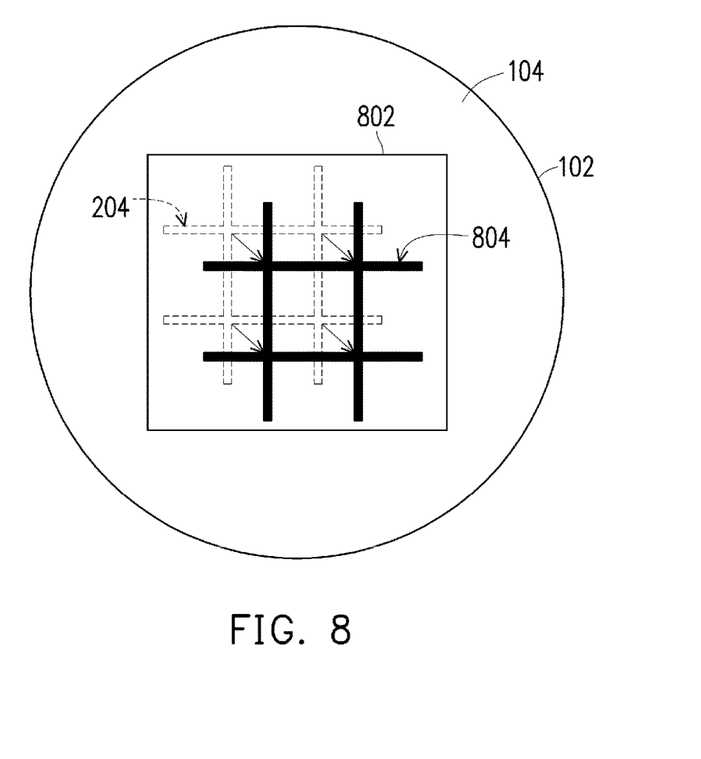
FIG. 8 illustrates a top view of a second photomask having a second pattern in accordance with one implementation.

FIG. 8 illustrates a simplified top view of a second photomask 802 having a second pattern 804 in accordance with one implementation. The second photomask 802 is substantially identical to the first photomask 202 except that the second pattern 804 is diagonally shifted by a half mask pitch from the first pattern 204. The first pattern 204 is depicted in dotted line for illustration purposes only. Like the first pattern 204, the second pattern 804 may be a grid-like pattern having a constant mask pitch greater than 1 micrometer, such as about 1.15 micrometers to about 3 micrometers, for example about 1.2 micrometers to about 1.9 micrometers. In one implementation, the grid-like pattern has a mask pitch of about 1.8 micrometers. Diagonal shift of the second pattern 804 allows pixel regions to be formed in the device substrate 102 in a grid-like arrangement.

While a diagonal shift of the second pattern 804 is discussed, the second pattern 804 may be offset by a half mask pitch from the first pattern 204 in any desired direction such as in a lateral or vertical way to double the density of the isolation regions in the device substrate 102, as will be discussed in more detail below. In addition, it is understood that the second pattern 804 is not limited to the grid-like pattern as shown. The second pattern 804 may be any other arrangements of patterns and works with the first pattern 204 so that the second photoresist layer 602 is patterned to provide second photoresist columns having a resist pitch greater than 1 micrometer, for example about 1.2 micrometers to about 1.9 micrometers.

During the second lithography process, the mask stage is operable to secure the second photomask 802 and manipulate the photomask in transitional and/or rotational modes. The substrate stage holding the device substrate 102 may also be manipulated in transitional and/or rotational modes. An alignment device is used to align the photomask and the substrate so that the radiation beam exposes a field (e.g., the field 206 shown in FIG. 2) on the device substrate 102. The radiation beam, such as a Krypton Fluoride (KrF) excimer laser with wavelength of 248 nm or an Argon Fluoride (ArF) excimer laser with a wavelength of 193 nm, may scan over the second photomask 802 to expose the field on the device substrate 102. As such, the second pattern 804 is transferred onto the second photoresist layer 602 at the exposure field. The lithography apparatus steps the device substrate 102 to a next field (e.g., one scanning field) to expose another field. This step-and-scan process may be performed in the same fashion as the first lithography process until the entire device substrate 102 is exposed with the second pattern 804.

While two different photomasks (i.e., first and second photomasks 202, 802) are used to pattern the first and second photoresist layers 108, 602, respectively, it is contemplated that the first and second lithography processes may use the same photomask to pattern the first and second photoresist layers 108, 602 by moving either the mask stage or the substrate stage to achieve the half mask pitch offset movement.

Figure 9:
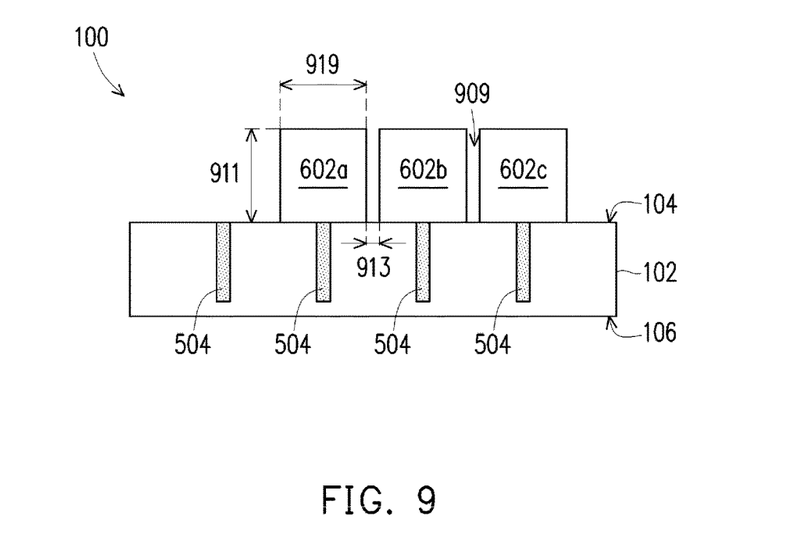
FIG. 9 illustrates a cross-sectional view of a portion of the image sensor device having patterned second photoresist layer on the device substrate in accordance with one implementation.

FIG. 9 illustrates a simplified cross-sectional view of a portion of the image sensor device 100 having patterned second photoresist layer 602 on the device substrate 102 in accordance with one implementation. As can be seen, the second pattern 804 has been transferred to the second photoresist layer 602 to form second photoresist columns 602a, 602b, 602c on the front side 104 of the device substrate 102. While not shown, it is understood that the patterned photoresist layer 602 has the grid-like pattern similar to the arrangement of the first photoresist columns 108a-108i shown in FIG. 3 except that the second photoresist columns 602a, 602b, 602c are offset diagonally by half pitch from the first photoresist columns 108a-108i.

The second photoresist columns 602a, 602b, 602c are separated by a trench 909. The trench 909 has a height 911 (vertical dimension), which equals to the height of the second photoresist columns 602a, 602b, 602c, and a width 913 (lateral dimension). The trench 909 has the same aspect ratio as that of the trench 109. For example, the trench 909 may have an aspect ratio of 10:1 or above, such as about 12:1 to about 30:1, for example about 13:1 to about 25:1. In one implementation, the trench 909 has an aspect ratio of 15:1 to 20:1. Similarly, for a pixel size on the order of 1 micrometer, each of the second photoresist columns 602a, 602b, 602c may have an aspect ratio of about 1:1 to about 3:1 or lower, such as about 2:1. In one implementation, each of the second photoresist columns 602a, 602b, 602c has an aspect ratio of about 1:1. Therefore, the aspect ratio of the second photoresist columns 602a, 602b, 602c is lower than the aspect ratio of the trench 909. In various implementations, the width 919 of each of the second photoresist columns 602a, 602b, 602c to the width 913 of the trench 909 may be at a ratio of about 4:1 to about 30:1, such as about 6:1 to about 20:1, for example about 8:1 to about 10:1.

Similarly, while the trench 909 has an ultrahigh aspect ratio of 10:1 or above, for example 13:1 or above, the second photoresist columns 602a, 602b, 602c have sufficient strength to withstand the capillary forces inside the trench 909 without collapsing due to the lower aspect ratio of the second photoresist columns 602a, 602b, 602c. Specifically, ultrahigh aspect ratio trench and lower aspect ratio of the second photoresist columns 602a, 602b, 602c result in the increased width 109 of each of the second photoresist columns 602a, 602b, 602c, which leads to good adhesion of the second photoresist columns 602a, 602b, 602c to the front side 104 of the device substrate 102. Therefore, the likelihood of the second photoresist columns 602a, 602b, 602c collapsing is reduced as compared to those high aspect ratio photoresist layers having a trench aspect ratio of 10:1 or greater. This means that the second photoresist columns 602a, 602b, 602c can be formed taller or closer together (i.e., having a higher aspect ratio trench between the second photoresist columns 602a, 602b, 602c) without risking the second photoresist columns 602a, 602b, 602c collapse. The combination of the lower aspect ratio of the second photoresist columns 602a, 602b, 602c (such as about 3:1 or lower) and an ultrahigh aspect ratio trench (such as 13:1 or greater) are advantageous in performing subsequent fabrication processes such as formation of second isolation regions by ion implantation.

In some implementations, the likelihood of the second photoresist columns 602a, 602b, 602c can be further decreased by applying a shrinkage material to the exposed surfaces of the second photoresist columns 602a, 602b, 602c, which will be discussed in more detail in FIGS. 15 and 16.

Figure 10:
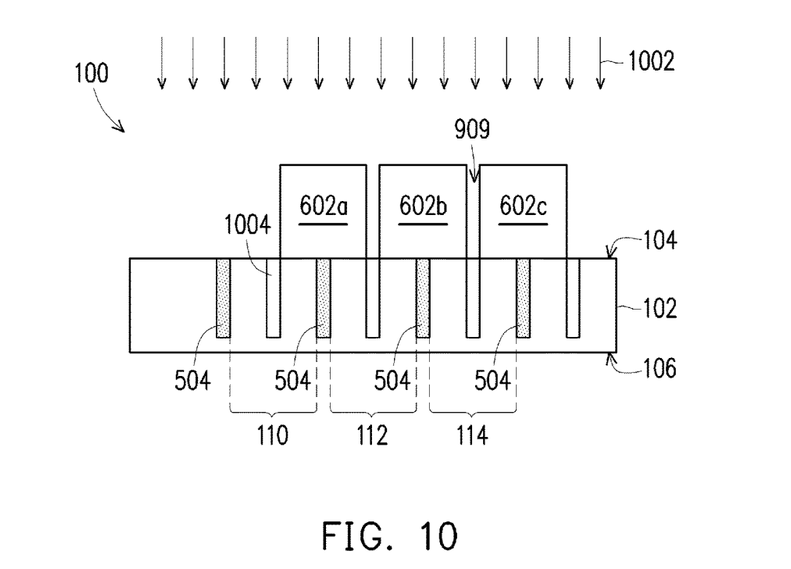
FIG. 10 illustrates a cross-sectional view of a portion of the image sensor device showing first and second isolation regions in accordance with one implementation.

After the second lithography process, the device substrate 102 is subjected to a second ion implantation process 1002 to form second isolation regions 1004 in the device substrate 102. The second ion implantation process 1002 is performed using the second photoresist columns 602a, 602b, 602c as a mask to implant ions into regions of the device substrate 102 that are not protected by the second photoresist columns 602a, 602b, 602c. Since the second photoresist columns 602a, 602b, 602c are offset by half pitch from the first photoresist columns 108a-108i, the resulting second isolation regions 1004 will divide each of the pixel regions 110, 112, and 114 in half and isolate the divided pixel regions from each other. The second isolation regions 1004 prevent carriers at a specific pixel region to leak to adjacent pixel region. The second isolation regions 1004 may exceed the depth of each pixel to be formed in the divided pixel regions. In some implementations, the second isolation regions 1004 may extend from the front side 104 to the back side 106 of the device substrate 102 to provide complete isolation well between the divided pixel regions. Since the second photoresist columns 602a, 602b, 602c are formed with ultrahigh aspect ratio trench between the second photoresist columns 602a, 602b, 602c, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device 100.

Similar to the first isolation regions 504, the second isolation regions 1004 may be formed of p-type or n-type materials and contain the same doping polarity as the device substrate 100. For example, the second isolation regions 1004 may be p-type regions formed by implanting the device substrate 102 with p-type dopants such as boron, boron fluoride ($BF_2$), diborane ($B_2H_6$), or the like. The doping concentration of the second isolation regions 1004 may be of approximately $1\times10^{12}$ ions/cm$^3$ and up to approximately $5\times10^{17}$ ions/cm$^3$, like the first isolation regions 504. Each second isolation region 1004 may have an aspect ratio of 10:1 or above, for example about 12:1 to about 15:1.

In cases where the second pattern 804 uses a grid-like pattern having a mask pitch of about 1.8 micrometers, the second lithography process and the second ion implantation process 1002 will form second isolation regions 1004 and the first isolation regions 504 at a constant pitch of about 0.9 micrometers, which is at sub-micrometer levels. By performing two lithography processes (i.e., two mask patterning process), the density of the pixel regions (such as pixel regions 1112a-1112g shown in FIG. 11) can be increased by more than double. As a result, the amount of light or radiation to be sensed by the pixels (i.e., light sensors) in the pixel regions 110, 112, and 114 is increased. Particularly, the lithography processes are performed using photoresist columns with ultrahigh aspect ratio trench (e.g., greater than 13:1) without the risk of photoresist pattern collapsing.

Figure 11:
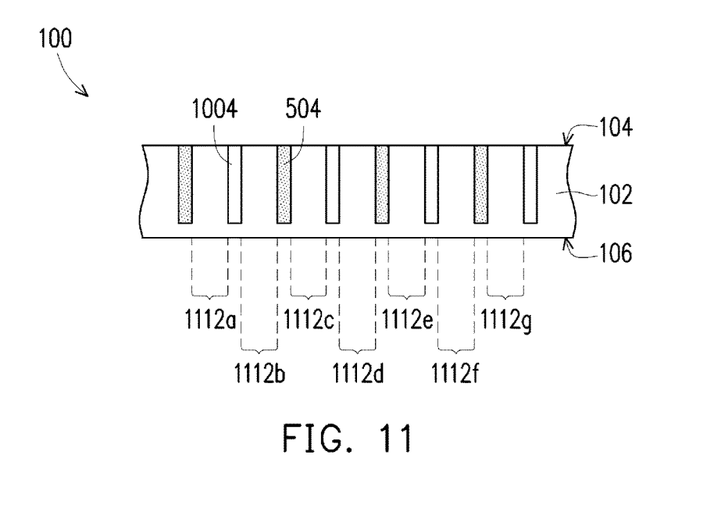
FIG. 11 illustrates a cross-sectional view of the image sensor device showing pixel regions in the device substrate in accordance with one implementation.

After the second isolation regions 1004 have been formed, the second photoresist columns 602a, 602b, 602c are removed, for example, using a photoresist ashing or stripping process. FIG. 11 illustrates a simplified cross-sectional view of the image sensor device 100 showing pixel regions, e.g., pixel regions 1112a-1112g, in the device substrate 102. It is contemplated that the processes described above can be repeated to obtain high density of isolation regions at sub-micrometer pitch or even below.

Figure 12:
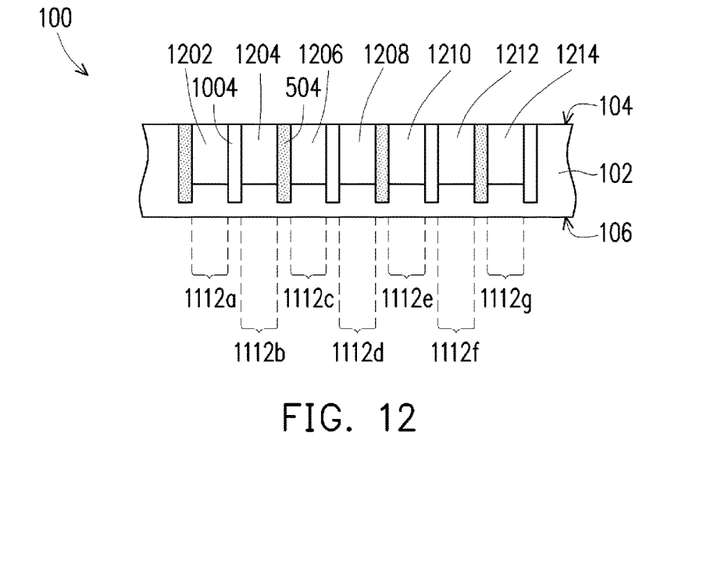
FIG. 12 illustrates a cross-sectional view of the image sensor device showing a plurality of pixels formed in the pixel regions in accordance with one implementation.

After the second photoresist columns 602a, 602b, 602c have been removed, a plurality of pixels 1202-1214 is formed in the pixel regions 1112a-1112g, respectively, as shown in FIG. 12. The pixels 1202-1214 may also be referred to as radiation-detection devices or light-sensors. The pixels 1202-1214 contain radiation-sensing regions. These radiation-sensing regions may be formed by one or more ion implantation processes and are doped with a doping polarity opposite from that of the device substrate 102 and/or the first and second isolations 504, 1004. In cases where the device substrate 102 is p-type substrate, the pixels 1202-1214 contain n-type doped regions. For a BSI image sensor device such as the image sensor device 100, the pixels 1202-1214 are operable to detect radiation that is projected toward the device substrate 102 from the back side 104. In some implementations, each of the pixels 1202-1214 includes a photodiode. A deep implant region may be formed below each photodiode in some implementations. In other implementations, the pixels 1202-1214 may each include pinned layer photodiodes, photogates, reset transistors, source follower transistors, and transfer transistors.

Figure 13:
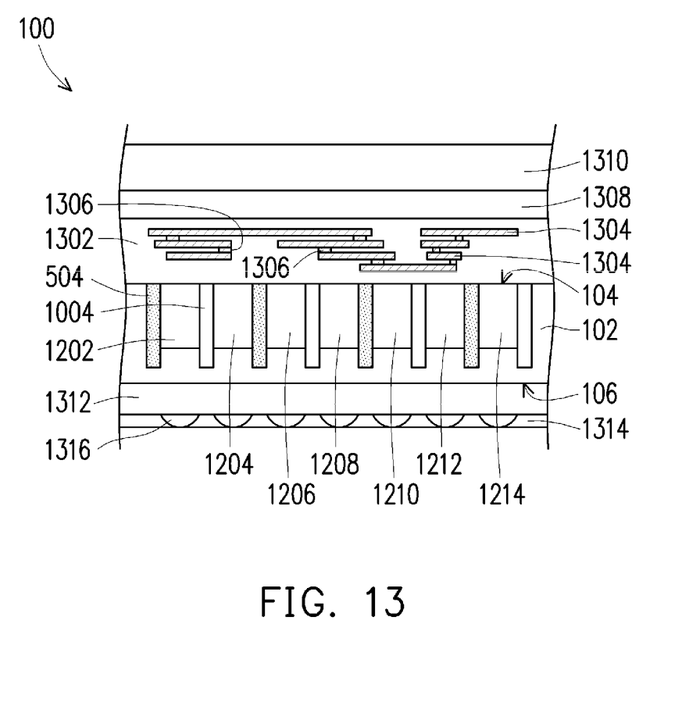
FIG. 13 illustrate a cross-sectional view of the image sensor device showing an interconnect structure over the front side of the device substrate in accordance with one implementation.

Additional fabrication processes may be performed to complete the fabrication of the image sensor device 100. For example, FIG. 13 illustrates an interconnect structure 1302 formed over the front side 104 of the device substrate 102. The interconnect structure 1302 may include a plurality of patterned dielectric layers and conductive layers that provide interconnections between the various doped features, circuitry, and input/output of the image sensor device 100. The interconnect structure 1302 may include an interlayer dielectric (ILD) and a multilayer interconnect (MLI) structure. The MLI structure includes contacts, vias and metal lines. For purposes of illustration, a plurality of conductive lines 1304 and vias/contacts 1306 are shown in FIG. 13. It is understood that the conductive lines 1304 and vias/contacts 1306 illustrated are merely exemplary as the actual positioning and configuration of the lines/vias/contacts may vary depending on design needs and manufacturing requirements.

A buffer layer 1308 may be formed on the interconnect structure 1302. The buffer layer 1308 may include a dielectric material such as silicon oxide or silicon nitride. Thereafter, a carrier substrate 1310 may be bonded with the device substrate 102 via the buffer layer 1308 so that processing of the back side 106 of the device substrate 102 can be performed. The carrier substrate 1310 may include a silicon substrate, a glass substrate, or any suitable substrate. The buffer layer 1308 provides electrical isolation between the device substrate 102 and the carrier substrate 1310. The carrier substrate 1310 provides support and mechanical strength for processing of the back side 106 of the device substrate 102.

After the carrier substrate 1310 is bonded, a thinning process is then performed to thin the device substrate 102 from the back side 106. The thinning process may include a mechanical grinding process and a chemical thinning process. After the thinning process, a color filter layer 1312 may be formed on the back side 106 of the device substrate 102. The color filter layer 1312 may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer 1314 containing a plurality of micro-lenses 1316 is formed over the color filter layer 1312. The micro-lenses direct and focus the incoming radiation toward specific radiation-sensing regions in the device substrate 102, such as pixels 1202-1214. The micro-lenses may be positioned in various arrangements and have various shapes depending on a refractive index of a material used for the micro-lens and distance from a sensor surface. It is understood that the sequence of the fabrication processes described above is not intended to be limiting. Some of the layers or devices may be formed according to different processing sequences in other implementations than what is shown herein. While the above discussions pertain to a BSI image sensor device, it is contemplated that the various aspects of the present disclosure may be applied to a front side illuminated (FSI) image sensor device as well.

Figure 14:
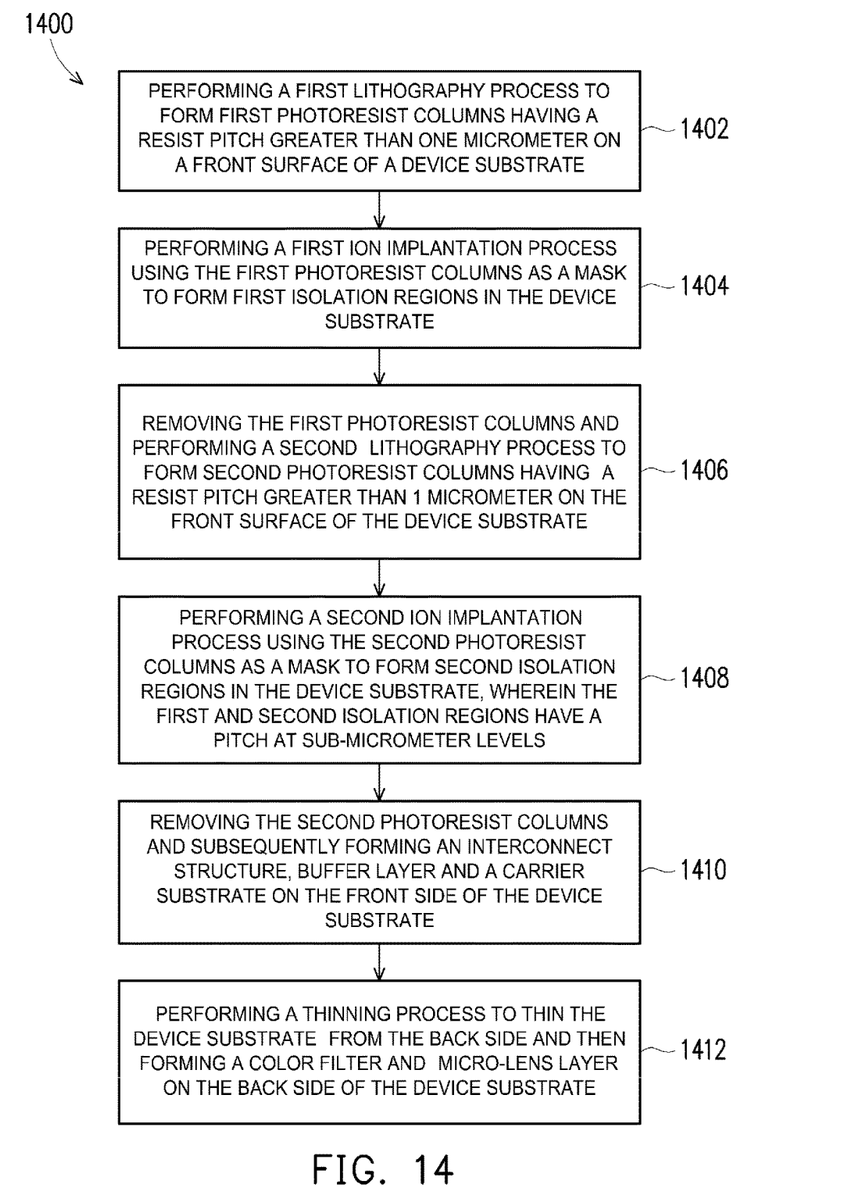
FIG. 14 is a flow chart illustrating an exemplary method for fabricating a semiconductor image sensor device according to various implementations of the present disclosure.

FIG. 14 is a flow chart illustrating an exemplary method 1400 for fabricating a semiconductor image sensor device according to various implementations of the present disclosure. At operation 1402, a first lithography process is performed using a first pattern of a first photomask to form first photoresist columns on a front side of a device substrate, such as the device substrate 102 shown in FIG. 1. The first photoresist columns are formed with a resist pitch of greater than 1 micrometer, for example about 1.2 micrometers to about 1.9 micrometers, and a trench between first photoresist columns has an ultrahigh aspect ratio of 13:1 or greater, as the device substrate 102 shown in FIG. 4.

At operation 1404, a first ion implantation process is performed using the first photoresist columns as a mask to implant first isolation regions in the device substrate. The implant isolation regions define pixel regions in the device substrate 102 shown in FIG. 5.

At operation 1406, the first photoresist columns are removed and a second lithography process is performed using a second pattern of a second photomask to form second photoresist columns on the front side of the device substrate. The second pattern is offset by a half mask pitch from the first pattern. The second photoresist columns are formed with a resist pitch of greater than 1 micrometer, for example about 1.2 micrometers to about 1.9 micrometers, and a trench between first photoresist columns has an ultrahigh aspect ratio of 13:1 or greater, such as the device substrate 102 shown in FIG. 9.

At operation 1408, a second ion implantation process is performed using the second photoresist columns as a mask to implant second isolation regions in the device substrate. The first and second isolation regions define pixel regions having a pixel region pitch at sub-micrometer levels (e.g., 0.75 micrometers to 0.95 micrometers), as the device substrate 102 shown in FIG. 10.

At operation 1410, the second photoresist columns are removed and an interconnect structure, a buffer layer, and a carrier substrate are subsequently formed on the front side of the device substrate, as the device substrate shown in FIG. 13.

At operation 1412, a thinning process is performed to thin the device substrate from the back side and then a color filter layer and a micro-lens layer are subsequently formed on the back side of the device substrate, as the device substrate 102 shown in FIG. 13.

In some implementations, a shrinkage material may be optionally applied to first and second photoresist columns 108a-108c and 602a-602c shown in FIGS. 4 and 9, respectively, to further prevent collapsing of photoresist columns due to capillary forces. For simplicity, the description herein will use first photoresist columns 108a-108c as an example. After the first photoresist columns 108a-108c have been formed, the first photoresist columns 108a-108c are exposed to a shrinkage material using a suitable technology such as a spin-coating process. The shrinkage material may be produced by mixing surfactant particles uniformly in a chemical material. The surfactant particles include compounds or molecules that lower the surface tension between liquids or between a liquid and a solid. For example, a surfactant particle includes a molecule having one end that is water-soluble and an opposite end that is oil-soluble. The surfactant molecules may aggregate to form micelles. In some implementations, each of the surfactant particles includes a fluorinated compound. In some other implementations, the surfactant particles include a hydrocarbon compound.

In one implementation, the chemical material includes a "resolution enhancement lithography assisted by chemical shrinkage" material (or RELACS). The RELACS material includes a water-soluble material (e.g., a polymer) having thermal cross-linking properties. As examples, the details of the RELACS material are discussed in an article entitled "Resists Join the Sub-Lambda Revolution," by Laura J. Peters, published in Semiconductor International, in September, 1999, as well as in Japanese Patent Application KOKAI publication No. H10-73927, the contents of each of which are hereby incorporated by reference in their respective entireties.

In another implementation, the chemical material includes a "shrink assist film for enhanced resolution" material (or SAFIER) developed by Tokyo Ohka Kogyo Co. The SAFIER material includes an aqueous solution that contains thermo-responsive polymers that facilitate photoresist flow during a baking process. The SAFIER material may or may not react with the photoresist chemically but provides mechanical support to the sidewalls of the photoresist as it flows. The mechanical support provided by the SAFIER material minimizes photoresist column profile degradation. The SAFIER material can be removed in a developing process following the baking. As an example, the details of the SAFIER material are discussed in a paper entitled "Electron-beam SAFIER™ process and its application for magnetic thin-film heads," by XiaoMin Yang, et al., published in the Journal of Vacuum Science & Technology B, Volume 22, Issue 6, in December 2004, the contents of which are hereby incorporated by reference in its entirety.

In one exemplary implementation, the shrinkage material containing RELACS material discussed above is applied on the first photoresist columns 108a-108c. A portion of the RELACS material applied on the first photoresist columns 108a-108c can become cross-linked to the photoresist columns 108a-108c and form a cross-linking film 1502, 1504, 1506 on exposed surfaces of the photoresist columns 108a-108c during a baking process, as shown in FIG. 15. The cross-linking films 1502, 1504, 1506 may be viewed as a part of the enlarged photoresist columns 108a-108c when they are used as a mask in the subsequent ion implantation process. The rest of the unreacted (e.g., un-cross-linked) RELACS material are removed in a developing process following the baking. Compared to the previous trench 109 shown in FIG. 4, the reduced trench 109a has an increased height (vertical dimension) 1508 and a reduced width (lateral dimension) 1510. The reduced width 1510 allows thinner isolation regions to be formed in the device substrate. For example, the first photoresist columns 108a-108c may be used as an ion implantation mask to form thinner isolation regions (and therefore wider pixel regions) for the image sensor device. In addition, the surfactant particles 1520 of the shrinkage material that are disposed on or near the sidewalls 1512, 1514, 1516, and 1518 of the cross-linking films 1502, 1504, 1506 reduce the surface tension of the sidewall surfaces. Capillary force is correlated with (or is a function of) the surface tension. Since the surface tension on the sidewalls 1512, 1514, 1516, and 1518 is reduced by the presence of the surfactant particles 1520 disposed thereon, the capillary forces inside the trench 109a are reduced, which diminishes the risks of the first photoresist columns 108a-108c collapse.

In another exemplary implementation, the shrinkage material containing SAFIER material discussed above is applied on the first photoresist columns 108a-108c. The SAFIER material contains thermo-responsive polymers that facilitate flowing of the first photoresist columns 108a-108c during the baking process. In other words, the first photoresist columns 108a-108c flow outward laterally and are reshaped as photoresist columns 1602, 1604, 1606, respectively. As shown in FIG. 16, the sidewalls of the photoresist columns 1602, 1604, 1606 before the flow occurs are illustrated herein as the broken lines, and the directions of the flow are illustrated using the arrows that point laterally. As can be seen, the sidewalls 1608, 1610, 1612, 1614 of the reshaped photoresist columns 1602, 1604, 1606 consequently move closer toward each other, thereby reducing the distance between the reshaped photoresist columns 1602, 1604, 1606. The height of the reshaped photoresist columns 1602, 1604, 1606 is also reduced due to the lateral expansion. The shrinkage material (i.e., the SAFIER material) also provides some mechanical support to the sidewalls 1608, 1610, 1612, 1614 of the reshaped photoresist columns 1602, 1604, 1606 during the photoresist flow, thereby allowing the sidewalls 1608, 1610, 1612, 1614 to maintain their shapes. Compared to the previous trench 109 shown in FIG. 4, the reduced trench 109b has a reduced height (vertical dimension) 1618 and a reduced width (lateral dimension) 1620. The reduced width 1620 allows thinner isolation regions to be formed in the device substrate. For example, the reshaped photoresist columns 1602, 1604, 1606 may be used as an ion implantation mask to form thinner isolation regions (and therefore wider pixel regions) for the image sensor device.

At least some of the surfactant particles 1616 of SAFIER that are disposed on (or near) the sidewalls 1608, 1610, 1612, 1614 reduce surface tension of the sidewall 1608, 1610, 1612, 1614. As discussed above, capillary force is correlated with (or is a function of) the surface tension. Since the surface tension on the sidewalls 1608, 1610, 1612, 1614 is reduced by the presence of the surfactant particles 1616 disposed thereon, the capillary forces contributing to collapse are reduced as well, which diminishes the risks of the first photoresist columns 108a-108c collapse.

Implementations of the present disclosure provide a method to form isolation regions at sub-micrometer levels for an image sensor device by using two lithography processes and optional shrinkage material applied to the photoresist columns provided by the lithography processes. The photoresist columns are formed with low aspect ratio and ultrahigh aspect ratio trench between the photoresist columns without collapsing the photoresist columns. In addition, since the photoresist columns are formed with ultrahigh aspect ratio trench between the photoresist columns, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device. In cases where a shrinkage material is used, the shrinkage material can form a cross-linking film onto exposed surfaces of the photoresist columns. The cross-linking film reduces the surface tension of the photoresist columns, which in turn reduces the capillary forces inside the trench and thus prevents collapsing of the photoresist columns. In addition, the cross-linking film formed on the photoresist columns reduces the width of the trench between photoresist columns. The reduced trench width of the photoresist columns can be used as an ion implantation mask to form thinner isolations regions (and thus wider pixel regions), which improves light sensing capability of the image sensor device.

In one implementation, a method of fabricating a semiconductor device includes forming a plurality of first trenches in a first photoresist layer using a first photomask having a first pattern to expose a first surface of a substrate disposed below the first photoresist layer, directing ions into the exposed first substrate of the substrate through the plurality of the first trenches to form a plurality of first isolation regions in the substrate, removing the first photoresist layer, forming a plurality of second trenches in a second photoresist layer using a second photomask having a second pattern to expose a second surface of the substrate, the second pattern being shifted diagonally from the first pattern by half mask pitch, directing ions into the exposed second surface of the substrate through the plurality of the second trenches to form a plurality of second isolation regions in the substrate, the first isolation regions and the second isolation regions being alternatingly disposed in the substrate, and the first isolation regions and the second isolation regions defining a plurality of pixel regions therebetween, and removing the second photoresist layer.

In another implementation, a method of fabricating a semiconductor device includes forming first photoresist columns on a first surface of a substrate by using a first photomask having a first pattern, the first photoresist columns being separated from each other by a first trench, wherein an aspect ratio of the first photoresist columns is lower than an aspect ratio of the first trench, performing a first ion implantation process using the first photoresist columns as a mask to form first isolation regions in the substrate, removing the first photoresist columns, forming second photoresist columns on the first surface of the substrate by using a second photomask having a second pattern, the second photoresist columns being separated from each other by a second trench, wherein an aspect ratio of the second photoresist columns is lower than an aspect ratio of the second trench, and the second pattern being offset from the first pattern, performing a second ion implantation process using the second photoresist columns as a mask to form second isolation regions in the substrate, removing the second photoresist columns, and defining a pixel region between any of the first isolation regions and any of the second isolation regions.

In yet another implementation, a method of fabricating a semiconductor device includes forming first photoresist columns on a first surface of a substrate by using a first photomask having a first pattern, the first photoresist columns being separated from each other by a first trench, wherein an aspect ratio of the first photoresist columns is lower than an aspect ratio of the first trench, exposing the first photoresist columns to a chemical shrinking process to shrink the first trench, performing a first ion implantation process using the first photoresist columns as a mask to form first isolation regions in the substrate, removing the first photoresist columns, forming second photoresist columns on the first surface of the substrate by using a second photomask having a second pattern, the second photoresist columns being separated from each other by a second trench, wherein an aspect ratio of the second photoresist columns is lower than an aspect ratio of the second trench, and the second pattern being offset from the first pattern, exposing the second photoresist columns to the chemical shrinking process to shrink the second trench, performing a second ion implantation process using the second photoresist columns as a mask to form second isolation regions in the substrate, the first isolation regions and the second isolation regions being alternatingly disposed in the substrate, and the first isolation regions and the second isolation regions defining a plurality of pixel regions therebetween, removing the second photoresist columns, and forming one or more pixels in a pixel region.

The foregoing outlines features of several implementations so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the implementations introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of fabricating a semiconductor device, comprising:
    forming a plurality of first trenches in a first photoresist layer using a first photomask having a first pattern to expose a first surface of a substrate disposed below the first photoresist layer;
    directing ions into the exposed first substrate of the substrate through the plurality of the first trenches to form a plurality of first isolation regions in the substrate;
    removing the first photoresist layer;
    forming a plurality of second trenches in a second photoresist layer using a second photomask having a second pattern to expose a second surface of the substrate, the second pattern being shifted diagonally from the first pattern by half mask pitch;
    directing ions into the exposed second surface of the substrate through the plurality of the second trenches to form a plurality of second isolation regions in the substrate, the first isolation regions and the second isolation regions being alternatingly disposed in the substrate, and the first isolation regions and the second isolation regions defining a plurality of pixel regions therebetween; and
    removing the second photoresist layer.

2. The method of claim 1, wherein each of the plurality of the first trenches and each of the plurality of the second trenches is formed with an aspect ratio of about 13:1 or greater.

3. The method of claim 1, wherein the first isolation regions and the second isolation regions have a constant pitch of less than 1 micrometer.

4. The method of claim 1, wherein forming a plurality of first trenches in a first photoresist layer is performed by using a first photomask having a first pattern, and forming a plurality of second trenches in a second photoresist layer is performed by using a second photomask having a second pattern that is identical to the first pattern, and the second pattern being about half mask pitch offset from the first pattern.

5. A method of fabricating a semiconductor device, comprising:
    forming first photoresist columns on a first surface of a substrate by using a first photomask having a first pattern, the first photoresist columns being separated from each other by a first trench, wherein an aspect ratio of the first photoresist columns is lower than an aspect ratio of the first trench;
    performing a first ion implantation process using the first photoresist columns as a mask to form first isolation regions in the substrate;
    removing the first photoresist columns;
    forming second photoresist columns on the first surface of the substrate by using a second photomask having a second pattern, the second photoresist columns being separated from each other by a second trench, wherein an aspect ratio of the second photoresist columns is lower than an aspect ratio of the second trench, and the second pattern being offset from the first pattern;
    performing a second ion implantation process using the second photoresist columns as a mask to form second isolation regions in the substrate;
    removing the second photoresist columns; and
    defining a pixel region between any of the first isolation regions and any of the second isolation regions.

6. The method of claim 5, wherein the aspect ratio of each of the first and second trenches is about 12:1 to about 30:1, and the aspect ratio of each of the first photoresist columns is about 1:1 to about 3:1.

7. The method of claim 5, wherein the first and second patterns have a constant mask pitch greater than 1 micrometer.

8. The method of claim 5, wherein each of the first photoresist columns is formed with a first width and the first trench is formed with a second width, and a ratio of the first width to the second width is about 4:1 to about 30:1.

9. The method of claim 5, wherein the first pattern and the second pattern are identical.

10. The method of claim 9, wherein the first pattern and the second pattern each has a constant mask pitch of about 1.2 micrometers to about 1.9 micrometers.

11. The method of claim 9, wherein the first pattern and the second pattern each includes a grid-like pattern.

12. The method of claim 11, wherein the second pattern is shifted diagonally from the first pattern by half mask pitch.

13. The method of claim 5, wherein the first isolation regions and the second isolation regions each contains the same doping polarity as the substrate, and each of the one or more pixels has a radiation-sensing region doped with a doping polarity opposite from a doping polarity of the substrate.

14. The method of claim 5, further comprising:
    forming an interconnect structure over the first surface of the substrate;
    forming a buffer layer on the interconnect structure, the buffer layer comprising a dielectric material; and
    forming a carrier substrate on the buffer layer.

15. The method of claim 14, further comprising:
    performing a thinning process to thin the substrate from a second surface of the substrate opposing the first surface;
    forming a color filter layer over the second surface of the substrate; and
    forming a micro-lens layer over the color filter layer.

16. The method of claim 5, further comprising:
    narrowing a width of at least one of the first trench and the second trench by exposing at least one of the first photoresist columns and second photoresist columns, respectively, to a chemical mixture comprising a chemical material and surfactant particles; and subjecting the at least one of the first photoresist columns and the second photoresist columns to a baking process.

17. A method of fabricating a semiconductor device, comprising:
    forming first photoresist columns on a first surface of a substrate by using a first photomask having a first pattern, the first photoresist columns being separated from each other by a first trench, wherein an aspect ratio of the first photoresist columns is lower than an aspect ratio of the first trench;
    exposing the first photoresist columns to a chemical shrinking process to shrink the first trench;
    performing a first ion implantation process using the first photoresist columns as a mask to form first isolation regions in the substrate;
    removing the first photoresist columns;
    forming second photoresist columns on the first surface of the substrate by using a second photomask having a second pattern, the second photoresist columns being separated from each other by a second trench, wherein an aspect ratio of the second photoresist columns is lower than an aspect ratio of the second trench, and the second pattern being offset from the first pattern;
    exposing the second photoresist columns to the chemical shrinking process to shrink the second trench;
    performing a second ion implantation process using the second photoresist columns as a mask to form second isolation regions in the substrate, the first isolation regions and the second isolation regions being alternatingly disposed in the substrate, and the first isolation regions and the second isolation regions defining a plurality of pixel regions therebetween;
    removing the second photoresist columns; and
    forming one or more pixels in a pixel region.

18. The method of claim 17, wherein the chemical shrinking process comprising:
    exposing the first or second photoresist columns to a chemical mixture comprising a chemical material and surfactant particles, the chemical mixture filling the first or second trench;
    subjecting the first or second photoresist columns to a baking process, the baking process causing the first or second trench to shrink, and at least a portion of the surfactant particles being disposed at sidewalls of the first or second trench to reduce the surface tension of the sidewalls; and
    removing the chemical mixture in the first or second trench and over the first or second photoresist columns.

19. The method of claim 17, wherein the first pattern and the second pattern each includes a grid-like pattern, and the second pattern is shifted diagonally from the first pattern by half mask pitch.

20. The method of claim 17, wherein the aspect ratio of each of the first and second trenches is about 12:1 to about 30:1, and the aspect ratio of each of the first photoresist columns is about 1:1 to about 3:1.

* * * * *